United States Patent

Numata et al.

[11] Patent Number: 5,811,352
[45] Date of Patent: Sep. 22, 1998

[54] METHOD OF MAKING RELIABLE METAL LEADS IN HIGH SPEED LSI SEMICONDUCTORS USING DUMMY LEADS

[75] Inventors: Ken Numata, Ibaragi, Japan; Kay Houston, Plano, Tex.

[73] Assignee: Texas Instruments Incorporated, Dallas, Tex.

[21] Appl. No.: 857,803

[22] Filed: Nov. 6, 1996

Related U.S. Application Data

[63] Continuation-in-part of Ser. No. 250,983, May 31, 1994, abandoned.

[51] Int. Cl.$^6$ .................................................. H01L 21/28
[52] U.S. Cl. ......................... 438/622; 438/623; 438/624; 438/926
[58] Field of Search ................................... 438/926, 623, 438/624, 922

[56] References Cited

U.S. PATENT DOCUMENTS

| | | |
|---|---|---|
| 4,797,375 | 1/1989 | Brownell . |
| 4,916,514 | 4/1990 | Nowak ...................................... 357/68 |
| 4,987,101 | 1/1991 | Kaanta et al. . |
| 5,103,288 | 4/1992 | Sakamoto et al. . |

(List continued on next page.)

FOREIGN PATENT DOCUMENTS 890150100  6/1989  Japan .

OTHER PUBLICATIONS

Fukada, et al., "Preparation of SiOF Films with Low Dielectric Constant by ECR Plasma Chemical Vapor Deposition", International Conference of Solid State Devices and Materials, 1993, pp. 158–160.

Bruesch et al., "Electrical and Infrared Dielectrical Properties of Silica Aerogels and of Silica–Aerogel–Based Composites", Appl. Phys. A57, 1993, pp. 329–337.

Ito, et al., "Application of Surface Reforemd Thick Spin–on–Glass to MOS Device Planarization", Electrochem, Soc., vol. 137, No. 4, Apr. 1990, pp. 1213–1218.

"Chronological Scientific Tables" Ed. Tokyo Astronomical Observatory, Published by Maruzen Tokyo (1986).

Goodson, et al., "Annealing–Temperature Dependence of the Thermal Conductivity of LPCVD Silicon–Dioxide Layers", IEEE Device Letters, vol. 14, No. 10, Oct., 1993, pp. 490–492.

E.U. Condon, Ph.D., "Heat and Thermodynamics", Handbook of Physics, Second Edition.

Musaka, et al., "Single Step Gap Filling Technology for Subhalf Micron Metal Spacings on Plasma Enhanced TEOS/$O_2$ Chemical Vapor Deposition System", Applied Materials Japan Inc. Technology Center, pp. 510–512.

USAMI, et al., "Low Dielectric Constant Interlayer Using Fluoride Doped Silicon Oxide", 1993 International Conference on Solid State Devices and Materials, Makuhari, pp. 161–163.

*Primary Examiner*—John Niebling
*Assistant Examiner*—Thomas G. Bilodeau
*Attorney, Agent, or Firm*—Kay Houston; W. James Brady, III; Richard L. Donaldson

[57] ABSTRACT

A method for manufacturing semiconductor device having conductive metal leads 14 with improved reliability, and device for same, comprising conductive metal leads 14 on a substrate 12, a first insulating material 18 at least between the conductive metal leads 14, and dummy leads 16 proximate the conductive metal leads 14. Heat from the conductive metal leads 14 is transferable to the dummy leads 16, and the dummy leads 16 are capable of dissipating the heat. The first insulating material 18 has a dielectric constant of less than 3.5. An optional heatsink 22 may be formed in contact with the first dummy leads 16 to further dissipate the Joule's heat from the conductive metal leads 14. An advantage of the invention is to improve reliability of metal leads for circuits using low-dielectric constant materials.

6 Claims, 3 Drawing Sheets

U.S. PATENT DOCUMENTS

| | | | |
|---|---|---|---|
| 5,112,761 | 5/1992 | Matthews . | |
| 5,130,782 | 7/1992 | Ashwell . | |
| 5,155,576 | 10/1992 | Mizushima . | |
| 5,182,235 | 1/1993 | Eguchi | 437/238 |
| 5,185,653 | 2/1993 | Switky et al. . | |
| 5,424,577 | 6/1995 | Suzuki et al. . | |
| 5,441,915 | 8/1995 | Lee | 437/195 |
| 5,459,093 | 10/1995 | Kuroda et al. | 437/51 |
| 5,461,003 | 10/1995 | Havemann et al. | 437/187 |
| 5,470,802 | 11/1995 | Gnade et al. | 437/238 |
| 5,476,817 | 12/1995 | Numata | 437/195 |
| 5,486,493 | 1/1996 | Jeng | 437/195 |
| 5,488,015 | 1/1996 | Havemann et al. | 437/195 |
| 5,510,293 | 4/1996 | Numata | 437/195 |
| 5,512,775 | 4/1996 | Cho . | |
| 5,519,250 | 5/1996 | Numata . | |
| 5,591,677 | 1/1997 | Jeng . | |
| 5,616,959 | 4/1997 | Jeng . | |

METHOD OF MAKING RELIABLE METAL LEADS IN HIGH SPEED LSI SEMICONDUCTORS USING DUMMY LEADS

This is a continuation in-part of U.S. patent application Ser. No. 08/250,983, filed May 31, 1994, now abandoned.

CROSS-REFERENCE TO RELATED APPLICATIONS

The following co-assigned U.S. patent applications are hereby incorporated herein by reference:

| Serial No | Filing Date | Inventor | Title |
| --- | --- | --- | --- |
| 08/137,658 | 10/15/93 | Jeng | Planarized Structure for Line-to-Line Capacitance Reduction |
| 08/201,679 | 2/25/94 | Jeng et al. | Selective Filling Narrow Gaps with Low-dielectric-constant materials |
| 08/430,095 (U.S. Pat. No. 5,486,493) | 4/26/95 | Jeng | Planarized Multilevel Interconnect Scheme with Embedded Low-Dielectric-Constant Insulators |
| 08/234,443 | 4/28/94 | Cho | Low Dielectric Constant Insulation in VLSI applications |
| 08/234,099 | 4/27/94 | Havemann | Via Formation in Polymeric Materials |
| 08/247,195 (U.S. Pat. No. 5,470,802) | 5/20/94 | Gnade et al. | A Low Dielectric Constant Material for Electronics Applications |
| 08/246,432 (U.S. Pat. No. 5,488,015) | 5/20/94 | Havemann et al. | Interconnect Structure with an Integrated Low Density Dielectric |
| 08/250,063 (U.S. Pat. No. 5,461,003) | 5/27/94 | Havemann et al. | Multilevel Interconnect Structure with Air Gaps Formed Between metal leads |
| 08/250,142 | 5/27/94 | Havemann | Two-step Metal Etch Process for Selective Gap Fill of Submicron Interconnects and Structure for Same |
| 08/250,747 | 5/27/94 | Gnade et al. | Low Dielectric Constant Layers via Immiscible Sol-gel Processing |

The following U.S. patent applications were filed concurrently with the parent patent application for the present invention and are also incorporated herein by reference:

| TI Case Serial No. | Inventor | Title |
| --- | --- | --- |
| 08/251,822 (U.S. Pat. No. 5,510,293) | Numata | Method of Making Reliable Metal Leads in High Speed LSI Semiconductors using Thermoconductive Dielectric Layer |
| 08/250,888 (U.S. Pat. No. 5,476,817) | Numata | Method of Making Reliable Metal Leads in High Speed LSI Semiconductors using both Dummy Leads and Thermoconductive Dielectric Layer |

FIELD OF THE INVENTION

This invention relates generally to the fabrication of semiconductor devices, and more specifically to semiconductors with submicron spacing and low-dielectric constant materials between the intermetallic leads.

BACKGROUND OF THE INVENTION

Semiconductors are widely used in integrated circuits for electronic applications, including radios and televisions. Such integrated circuits typically use multiple transistors fabricated in single crystal silicon. Many integrated circuits now contain multiple levels of metallization for interconnections.

Semiconductor devices are being scaled in the horizontal dimension to reduce wafer cost by obtaining more chips per wafer or by increasing circuit complexity by obtaining more transistors per chip. Although semiconductor devices are being scaled in the horizontal dimension, semiconductor devices are not generally being scaled in the vertical dimension (because the current density would exceed reliability limits). Thus, conductors may have a high aspect ratio (ratio of conductor height to conductor width of greater than one). With horizontal scaling, these tall metal leads are being packed closer and closer together, causing capacitive coupling between the leads to become the primary limitation to circuit speed. If line-to-line capacitance is high, a likelihood for electrical inefficiencies and inaccuracies exist. Reducing the capacitance within these multi-level metallization systems will reduce the RC time constant between the lines.

Typically, the material used to isolate metal lines from each other is silicon dioxide. However, the dielectric constant of dense silicon oxide grown by thermal oxidation or chemical vapor deposition is on the order of 3.9. The dielectric constant is based on a scale where 1.0 represents the dielectric constant of a vacuum. Various materials exhibit dielectric constants from very near 1.0 to values in the hundreds. As used herein, the term low-dielectric will refer to a material with a dielectric constant of less than 3.5.

SUMMARY OF THE INVENTION

Recently, attempts have been made to use low-dielectric constant materials to replace silicon dioxide as a dielectric material. The use of low-dielectric constant materials as insulating layers reduces the capacitance between the lines (or leads), thus reducing the RC time constant. An apparently heretofore-unrecognized problem (especially in high aspect ratio metal leads) is that the decreased thermal conductivity of low-dielectric constant materials may result in metal lead breakage due to the effects of Joule's heat. The present invention solves this problem by improving the thermal conductivity of the structure, resulting in improved reliability of metal leads in structures using low-dielectric constant materials.

The invention encompasses a method for manufacturing semiconductor devices having metal leads with improved reliability, and a device for same, comprising conductive metal leads on a substrate, a first insulating material at least between the conductive metal leads, and dummy leads proximate the conductive metal leads. Heat from the conductive metal leads is transferable to the dummy leads, and the dummy leads are capable of dissipating the heat. The dummy leads are non-current conducting metal leads, and the first insulating material has a dielectric constant of less than 3.5. An optional heatsink may be connected to the dummy leads to further improve heat dissipation away from the conductive metal leads. An advantage of the invention is to improve reliability of metal leads for circuits using low-dielectric constant materials.

One embodiment of the invention involves depositing a metal interconnect layer on a substrate and etching the metal interconnect layer in a predetermined pattern to form conductive metal leads and dummy leads, where the dummy leads are proximate the conductive metal leads. Then, a first insulating material is deposited at least between the conductive metal leads. An optional heatsink may be connected to the dummy leads.

Another embodiment involves providing a substrate, depositing a first metal interconnect layer on the substrate and etching the first metal interconnect layer in a predetermined pattern to form conductive metal leads. Then a first insulating material is deposited between the conductive metal leads. A first thin oxide layer is deposited over the first insulating material, and a second metal interconnect layer is deposited on the thin oxide layer. The second interconnect layer is etched in a predetermined pattern to form first dummy leads, wherein the first dummy leads are adjacent to a portion of the conductive metal leads of the first metal interconnect layer. Heat from the conductive metal leads is transferable to the first dummy leads and dissipatable. An optional heatsink may be connected to the first dummy leads. Furthermore, a third interconnect layer may be deposited on the substrate, and second dummy leads may be formed within the second interconnect layer. A third insulating material may be deposited over the second dummy leads. A second thin oxide layer may be deposited over the second dummy leads and third insulating material, and then the first metal interconnect layer may be formed over the second thin oxide layer. Conductive metal leads may be formed in the first metal interconnect layer adjacent the second dummy leads. An optional heatsink may be connected to the second dummy leads.

An advantage of the invention is to improve reliability of metal leads for circuits using low-dielectric constant materials. The invention is particularly beneficial to semiconductors having a combination of metal leads with high aspect ratios and low-dielectric constant materials which are more thermally insulating.

BRIEF DESCRIPTION OF THE DRAWINGS

In the drawings, which form an integral part of the specification and are to be read in conjunction therewith, and in which like numerals and symbols are employed to designate similar components in various views unless otherwise indicated.

DETAILED DESCRIPTION OF PREFERRED EMBODIMENTS

Figure 1A:
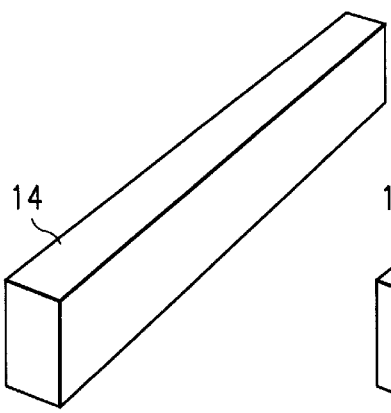
FIGS. 1A–1C are three-dimensional views of a metal lead of a semiconductor wafer, showing the negative effects of Joule's heat.

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of several preferred embodiments and alternative embodiments, including manufacturing methods. Corresponding numerals and symbols in the different figures refer to corresponding parts unless otherwise indicated. Table 1 below provides an overview of the elements of the embodiments and the drawings.

TABLE 1

| Drawing Element | Preferred or Specific Examples | Generic Term | Other Alternate Examples or Descriptions |
|---|---|---|---|
| 10 | | Semi-conductor wafer | |
| 12 | Silicon | Substrate | May be other metal interconnect layers or semiconductor elements, (e.g. transistors, diodes); Oxides; Compound semiconductors (e.g. GaAs, InP, Si/Ge, SiC). |
| 14 | Aluminum alloy | Conductive metal leads | Titanium trilayer (TiN/AlCu/TiN); Alloys of Cu, Mo, W, Ti, Si; Polysilicon, silicides, nitrides, carbides; AlCu alloy with Ti or TiN underlayers; Metal interconnect layer. |
| 16 | Aluminum alloy | Dummy leads | First dummy leads; Titanium trilayer (TiN/AlCu/TiN); Alloys of Cu, Mo, W, Ti, Si; Polysilicon, silicides, nitrides, carbides; AlCu alloy with Ti or TiN underlayers. |
| 16' | Aluminum alloy | Second dummy leads | Titanium trilayer (TiN/AlCu/TiN); Alloys of Cu, Mo, W, Ti, Si; Polysilicon, silicides, nitrides, carbides; AlCu alloy with Ti or TiN underlayers. |
| 18 | OSOG (organic spin-on glass) | First insulating material | Low-dielectric constant material; air gap (also inert gases, vacuum); silica aerogel; other aerogels or xerogels; fluorinated silicon oxide. |
| 20 | $SiO_2$ | Thin oxide layer | First thin oxide layer; insulating layer preferably having a thickness less than the height of conductive metal leads 14 |
| 20' | $SiO_2$ | Second thin oxide layer | Insulating layer preferably having a thickness less than the height of conductive metal leads 14 |
| 22 | Metal plane | Heatsink | Large metal surface; metal surface not connected to electrically-conducting circuitry; Titanium trilayer (TiN/AlCu/TiN); Alloys of Cu, Mo, W, Ti, Si; Polysilicon, silicides, nitrides, carbides; AlCu alloy with Ti or TiN underlayers. |
| 24 | $SiO_2$ | Second insulating material | Oxide, nitride, dense glass, solid inorganic, solid organic, other suitable rigid dielectric. |
| 24' | $SiO_2$ | Third insulating material | Oxide, nitride, dense glass, solid inorganic, solid organic, other suitable rigid dielectric. |

An apparently heretofore-unrecognized problem is that the decreased thermal conductivity of low-dielectric constant materials may result in metal lead breakage due to the effects of Joule's heat, especially in high aspect ratio conductors with low-dielectric constant material between conductors, where the low-dielectric constant material is on more than half the conductor perimeter. Since all metals have a certain amount of resistance, the temperature of a metal rises as a current passes through it. Such heat through a metal lead is known as Joule's heat. As a metal lead heats locally in one portion along it, the resistance in that portion rises slightly (due to properties of the metal), causing the temperature in that portion to rise even more (although slightly). Thus, locally heated metal leads can be damaged or fractured. The thinner the metal lead, the weaker it is (which is particularly a concern in submicron circuits). The use of low-dielectric constant materials as insulative layers further presents a problem, for such materials generally have poor thermoconductivity. With the use of low-dielectric constant materials, much more of the Joule's heat generated in metal leads of a circuit remains concentrated in the lead itself.

Figure 1B:
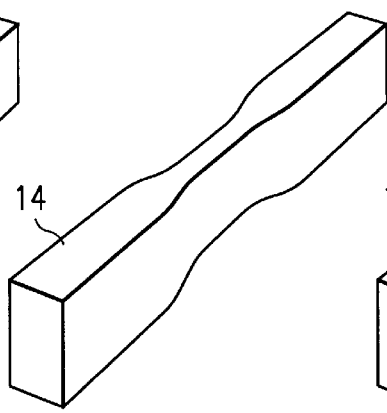
Figure 1C:
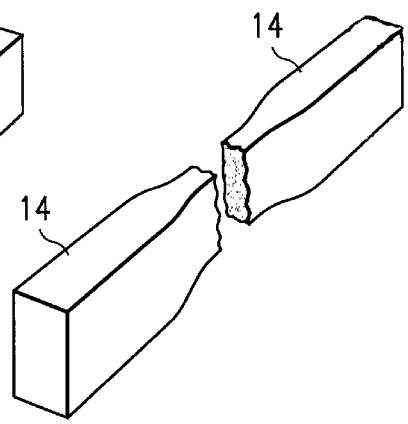

The effect of Joule's heat on a metal lead is shown in FIG. 1. FIG. 1A shows a metal lead 14 of a semiconductor wafer (other portions of the wafer are not shown). When current flows through metal lead 14, the metal lead is heated. In reality, a metal lead has thin and fragile portions. Such unevenness cannot be avoided because photolithography and etching processes of metal leads are not ideal. Electromigration, intensified by Joule's heat, causes the metal lead to first weaken, and then thin. Thin and fragile portions of the metal lead becomes thinner and thinner as current is cycled through the metal lead (FIG. 1B), and electromigration is even further intensified in this portion. Eventually such leads can break, as shown in FIG. 1C, resulting in device failures.

Figure 2A:
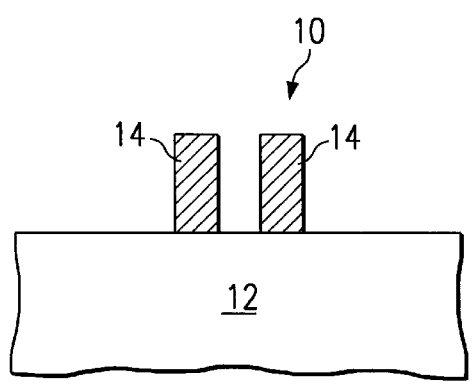
FIGS. 2A–2D are cross-sectional views of a first embodiment of the present invention, showing dummy leads formed on a semiconductor wafer.

The present invention improves reliability of metal leads in structures using low-dielectric constant materials by using dummy leads to improve the thermal conductivity of the structure. A first embodiment of the present invention is shown in FIGS. 2A–2D. FIG. 2A shows a cross-sectional view of a semiconductor wafer 10 having conductive metal leads 14 formed on a substrate 12. The substrate may, for example, contain transistors, diodes, and other semiconductor elements (not shown) as are well known in the art. The substrate 12 may also contain other metal interconnect layers, and typically contains a top insulating oxide layer (to prevent leads from shorting to each other in subsequent metal layers). A first metal interconnect layer has been deposited over the substrate 12. The first metal interconnect layer may comprise, for example, aluminum or a titanium-tungsten/aluminum bilayer. The first metal interconnect layer is etched with a predetermined pattern to form etch lines, or conductive metal leads 14. Some of the conductive metal leads 14 may be in close proximity to each other, for example, 1 $\mu$m or less apart.

Figure 2C:
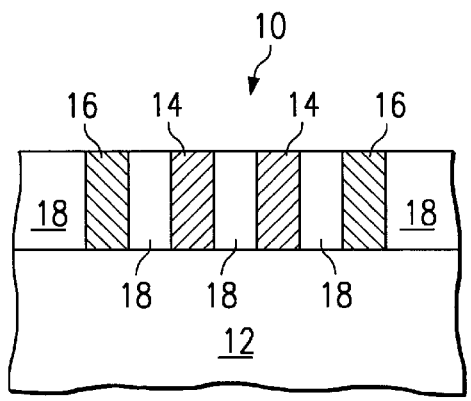
Figure 2B:
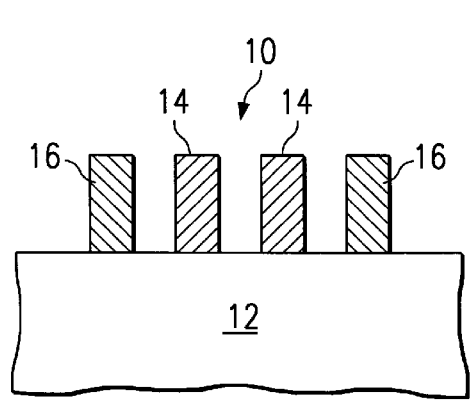

FIG. 2B shows the same semiconductor device as in FIG. 2A, with a first embodiment of the present invention implemented. Dummy leads 16 are formed adjacent conductive metal leads 14 in the same metal interconnect as conductive metal leads 14 are formed in. The term "dummy lead" refers to a non-current conducting metal lead placed in such proximity to a (current-conducting) conductive metal lead 14 so as to diffuse some of the Joule's heat away from the conductive metal lead. The dummy leads 16 diffuse some of the Joule's heat away from the conductive metal leads 14 when the device is in operation. The dummy leads 16 are non-current conducting, for example, not connected to electrically conductive circuitry. The dummy leads 16 are preferably placed away from the conductive metal leads 14 between ½ and 1 ½ the width of the conductive metal leads 14. The dummy leads 16 are more preferably spaced apart from the conductive metal leads 14 a distance of about one lead width.

Figure 2D:
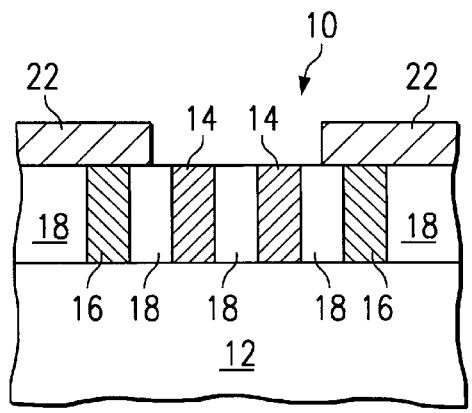

A first insulating material 18, comprising a low-dielectric constant material, preferably an organic spin-on glass (OSOG), is subsequently deposited between the conductive metal leads and dummy leads, as shown in FIG. 2C. Although first insulating material 18 may be a poor thermal conductor, it is relatively thin, allowing some of the Joule's heat to be diffused away from the conductive metal leads 14 through dummy leads 16. Since the dummy leads 16 are comprised of metal, they are excellent thermal conductors. The dummy leads 16 are generally spaced apart from the conductive metal leads 14 a distance of about one lead width. FIG. 2D shows dummy leads 16 connected to an optional heatsink 22 that is preferably not electrically connected to any conductive circuity. The heatsink 22 is a large conductive surface that further dissipates Joule's heat from conductive metal leads 14.

Figure 3A:
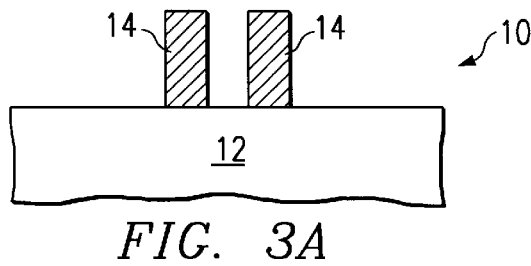
FIGS. 3A–3G are cross-sectional views of a second embodiment of the present invention, showing dummy leads formed adjacent conductive metal leads in adjacent parallel intermetallic layers.
Figure 3B:
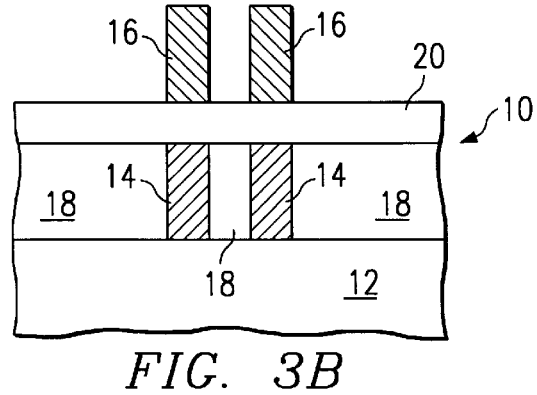
Figure 3C:
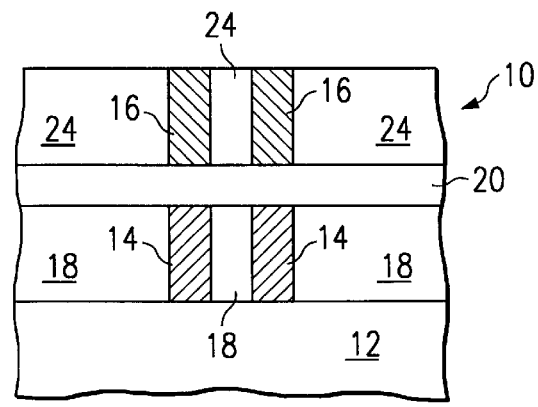
Figure 3D:
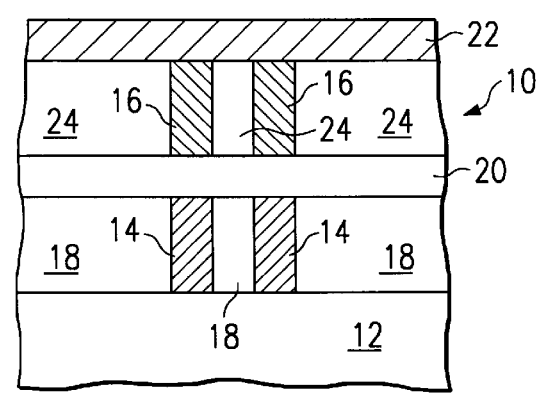

A second embodiment of the present invention is shown in FIGS. 3A–3G, where first dummy leads 16 are formed in an adjacent parallel metal layer. Semiconductor wafer 10 comprises a substrate 12. A first metal interconnect layer is deposited over the substrate 12, and conductive metal leads 14 are formed in the first metal interconnect layer (FIG. 3A). A first insulating material 18 is formed between the conductive metal leads 14. The first insulating material 18 comprises a low-dielectric constant material having a dielectric constant of less than 3.5. Then a first thin oxide layer 20, preferably having a thickness less than the height of conductive metal leads 14, is deposited on the conductive metal leads 14 and the first insulating material 18. A second metal interconnect layer (adjacent and parallel to first metal interconnect layer) is deposited over the first thin oxide layer 20, and first dummy leads 16 are formed adjacent the conductive metal leads 14 (see FIG. 3B). Preferably, the first dummy leads 16 are non-current conducting, for example, not connected to electrically conductive circuitry. The first thin oxide layer 20 must be thin enough to allow some of the Joule's heat from underlying conductive metal leads 14 to migrate through the first thin oxide layer 20 to reach the first dummy leads 16 formed in the second metal interconnect layer. A portion of the Joule's heat from conductive metal leads 14 is transferable through the first thin oxide layer 20 to the first dummy leads 16. A second insulating material 24 is then deposited over the first dummy leads 16, as shown in FIG. 3C. An optional heatsink 22 may be formed in contact with the first dummy leads 16 as shown in FIG. 3D to further dissipate the Joule's heat from the conductive metal leads 14. Subsequent processing steps may then be performed e.g. further deposition and etching of semiconductor, insulative and metallic layers.

Figure 3E:
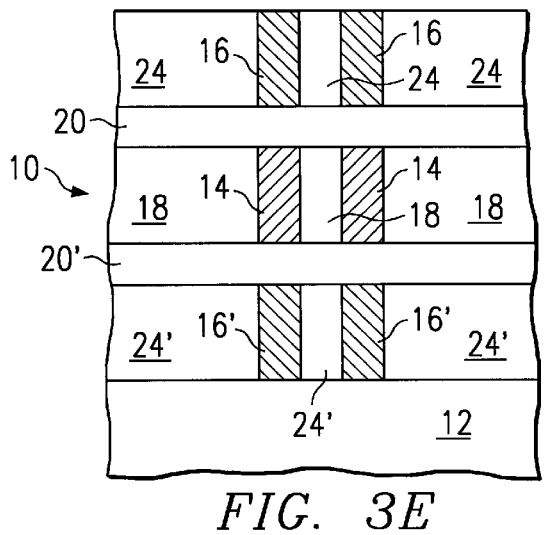
Figure 3F:
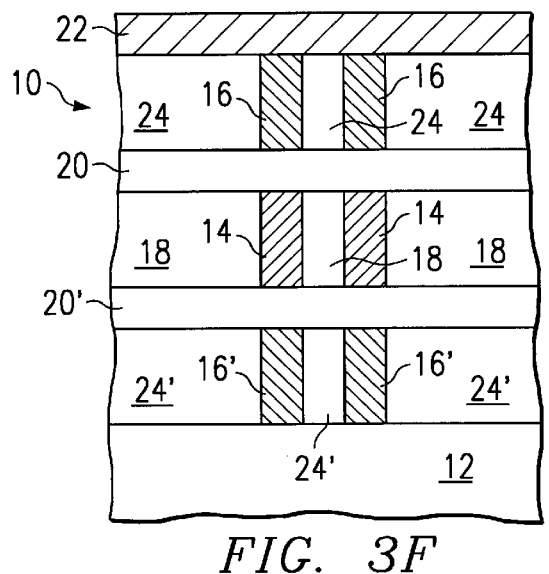

An alternate embodiment is shown in FIGS. 3E and 3F, where dummy leads are formed on the other side of the conductive metal leads, in adjacent parallel layers, sandwiching the conductive metal leads. Prior to depositing the first metal interconnect layer over the substrate 12, a third interconnect layer is deposited on the substrate 12, and second dummy leads 16' are formed in the third interconnect layer. A third insulating layer 24' is deposited between the second dummy leads 16'. A second thin oxide layer 20' is deposited over the second dummy leads 16' and the third insulating layer 24'. Then the conductive metal leads are formed from the first metal interconnect layer as described above for the second embodiment. An optional heatsink 22 may be connected to the (first) dummy leads 16 as shown in FIG. 3F, or to second dummy leads 16' (not shown), or both, to further dissipate Joule's heat from the conductive metal leads 14.

Figure 3G:
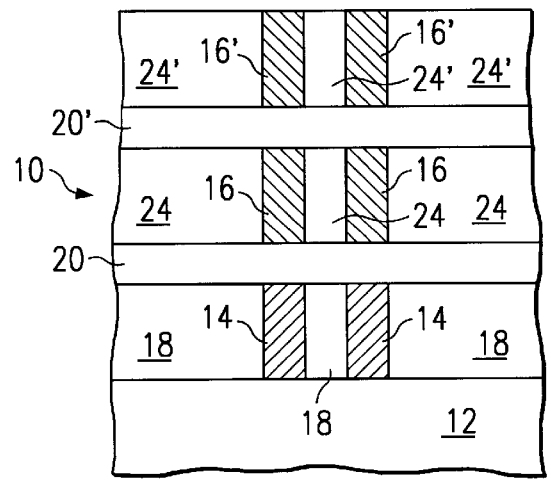

Another alternate embodiment is shown in FIG. 3G, where a first metal interconnect layer is deposited over the substrate 12, and conductive metal leads 14 are formed in the first metal interconnect layer (FIG. 3A). A first insulating material 18 is formed between the conductive metal leads 14. The first insulating material 18 comprises a low-dielectric constant material having a dielectric constant of less than 3.5. Then a first thin oxide layer 20, preferably having a thickness less than the height of conductive metal leads 14, is deposited on the conductive metal leads 14 and the first insulating material 18. A second metal interconnect layer (adjacent and parallel to first metal interconnect layer)

is deposited over the first thin oxide layer 20, and first dummy leads 16 are formed adjacent the conductive metal leads 14 (see FIG. 3B). Preferably, the first dummy leads 16 are non-current conducting, for example, not connected to electrically conductive circuitry. The first thin oxide layer 20 must be thin enough to allow some of the Joule's heat from underlying conductive metal leads 14 to migrate through the first thin oxide layer 20 to reach the first dummy leads 16 formed in the second metal interconnect layer. A portion of the Joule's heat from conductive metal leads 14 is transferable through the first thin oxide layer 20 to the first dummy leads 16. A second insulating material 24 is then deposited over the first dummy leads 16, as shown in FIG. 3C. Then a second thin oxide layer 20' is deposited over the second insulating layer 24 and first dummy leads 16. Second dummy leads 16' are formed adjacent first dummy leads 16 in the underlying layer, and third insulating layer 24' is deposited over the second dummy leads 16', as shown in FIG. 3G. Joule's heat from the conductive metal leads 14 is diffusible through first thin oxide layer 20 to first dummy leads 16, and further through second thin oxide layer 20' to second dummy leads 16'. Optional heatsinks 22 may be connected to either or both first dummy leads 16 and second dummy leads 16' (not shown).

Figure 4A:
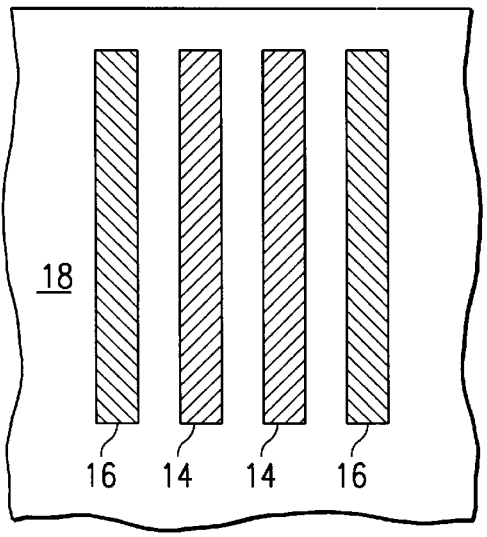
FIGS. 4A–4B are top views of an embodiment of the present invention.
Figure 4B:
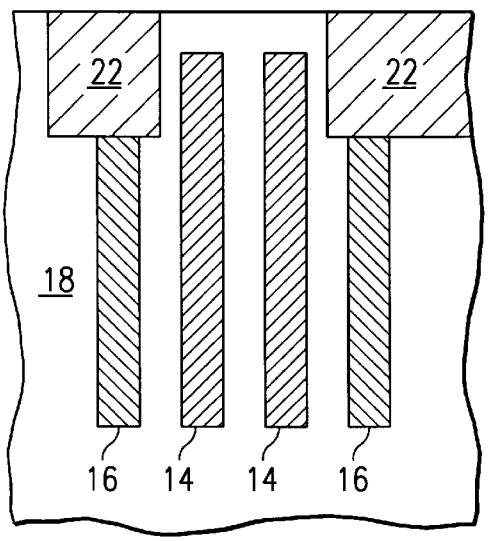
Figure 5A:
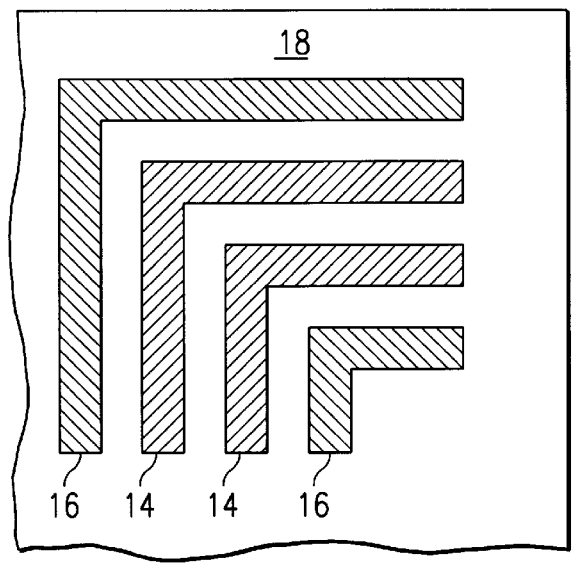
FIGS. 5A–5B are top views of an embodiment of the present invention.
Figure 5B:
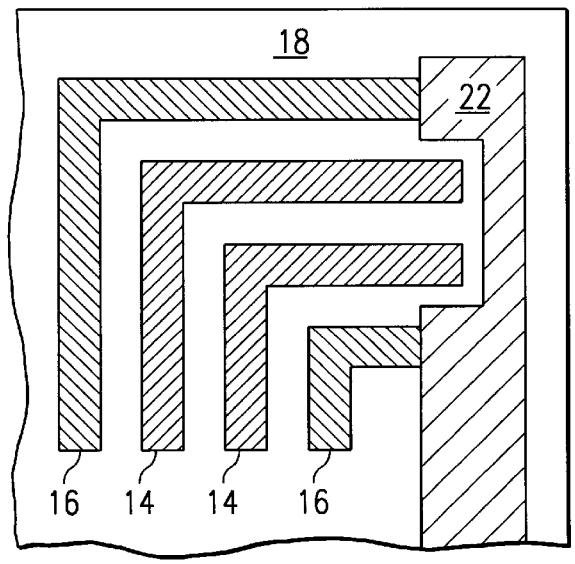

Various combinations of the disclosed invention can be utilized. For example, dummy leads may be formed both in the same metallic layer, as shown in FIG. 2C, and also formed in adjacent metallic layers, as shown in FIG. 3B. Preferably, the dummy leads 16 are spaced apart from the conductive metal leads 14 along the entire length of the conductive metal leads 14 by between ½ to 1 ½ a conductive metal lead with, and more preferably, by a distance of one conductive metal lead width, as shown in FIGS. 4A and 5A. Optional heatsinks 22 may be connected to dummy leads 16 at either end (as shown in FIGS. 4B and 5B), both ends, or along the length of the dummy lead 16 (not shown). The conductive metal leads 14 and dummy leads 16 may be straight as i n FIGS. 4A and 4B, or they may bend in various patterns, for example, as shown in FIGS. 5A and 5B.

The present invention can also be used on semiconductors using other low-dielectric constant materials as the first insulating material 18, such as air gaps, aerogels, xerogels, or fluorinated silicon oxide, for example. To reduce this capacitive coupling, low-dielectric constant materials are being investigated, such as pure polymers (e.g. parylene, teflon, polyimide) or organic spin-on glass (OSOG, e.g. silsequioxane or siloxane glass). Refer to U.S. Pat. No. 4,987,101 issued to Kaanta et al on Jan. 22, 1991 which describes a method for fabricating gas (air) dielectrics; and U.S. Pat. No. 5,103,288 issued to Sakamoto on Apr. 7, 1992 which describes a multilayered wiring structure which decreases capacitance by using a porous dielectric.

The novel method of using dummy leads to dissipate heat from conductive metal leads is especially beneficial to semiconductors having submicron spacing and using low-dielectric constant materials. The dummy leads diffuse a portion of the Joule's heat generated in the conductive metal leads, enhancing reliability of conductive metal leads. The non-current conducting dummy leads 16 and 16' do not emit heat from their own electrical current, which provides the advantage of maximizing the heat dissipation from the conductive metal leads 14. The invention is particularly beneficial to semiconductors having a combination of metal leads with high aspect ratios (e.g. 2 or greater) and low-dielectric constant materials (especially having a low-dielectric constant of less than 2) which are more thermally insulating. The heatsink 22 further diffuses Joule's heat away from the dummy leads 16 and 16'.

While the invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for enhancing reliability of conductive metal leads of a semiconductor device, comprising the steps of:

providing a substrate.

forming at least two conductive metal leads on said substrate, said conductive metal leads having a width; and then forming at least a first dummy lead in such proximity to said conductive metal leads as to dissipate Joule's heat from said conductive metal leads, said dummy lead being non-current-conducting, and depositing a first insulating material at least between said conductive metal leads, wherein said first insulating material has a dielectric constant of less than 3.5, and wherein said first insulating material is capable of passing said Joule's heat, wherein said dummy lead is spaced apart from said conductive metal leads along the entire length of said dummy lead.

2. A method for enhancing reliability of conductive metal leads of a semiconductor device, comprising the steps of:

providing a substrate, forming at least two conductive metal leads on said substrate, said conductive metal leads having a width; and then forming at least a first dummy lead in such proximity to said conductive metal leads as to dissipate Joule's heat from said conductive metal leads, said dummy lead being non-current-conducting, and depositing a first insulating material at least between said conductive metal leads, wherein said first insulating material has a dielectric constant of less than 3.5, and wherein said first insulating material is capable of passing said Joule's heat.

wherein the spacing between said conductive metal leads and said dummy lead is between ½ and 1 ½ the width of said conductive metal leads and wherein said dummy lead is spaced apart from said conductive metal leads along the entire length of said metal lead.

3. A method for enhancing reliability of conductive metal leads of a semiconductor device, comprising the steps of:

providing a substrate, forming at least two conductive metal leads on said substrate, said conductive metal leads having a width;

depositing a first insulating material at least between said conductive metal leads, wherein said first insulating material has a dielectric constant of less than 3.5, and wherein said first insulating material is capable of passing said Joule's heat;

depositing a first oxide layer over at least said first insulating material, wherein said first oxide layer has a thickness less than the width of said conductive metal leads; and forming at least a first dummy lead on said first oxide layer in such proximity to said conductive metal leads as to dissipate Joule's heat from said conductive metal leads, said dummy lead being non-current-conducting, between ½ and 1 ½ the width of said conductive metal leads, and spaced apart from said conductive metal leads along the entire length of said metal lead.

4. The method of claim 3, further comprising the steps of:

forming at least a second dummy lead on said substrate; and depositing a second oxide layer over said second dummy lead, after said step of providing a substrate.

5. The method of claim 3 wherein the spacing between said conductive metal leads and said dummy lead is the width of one said conductive metal leads.

6. The method of claim 3 further comprising, after the step of forming at least a first dummy lead, the steps of;

depositing a second oxide layer over said first dummy lead; and forming at least a second dummy lead on said second oxide layer in such proximity to said first dummy lead as to dissipate Joule's heat from said first dummy lead and said conductive metal leads.

* * * * *